US006870756B2

United States Patent
Ogawa et al.

(10) Patent No.: US 6,870,756 B2
(45) Date of Patent: Mar. 22, 2005

(54) SEMICONDUCTOR INTEGRATED CIRCUIT DEVICE

(75) Inventors: Yutaka Ogawa, Chitose (JP); Kazutomo Ogura, Chitose (JP); Naofumi Satou, Chitose (JP); Kiyotada Funane, Chitose (JP)

(73) Assignees: Renesas Technology Corporation, Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 0 days.

(21) Appl. No.: 10/670,532

(22) Filed: Sep. 26, 2003

(65) Prior Publication Data

US 2004/0085800 A1 May 6, 2004

(30) Foreign Application Priority Data

Nov. 5, 2002 (JP) ........................................ 2002-321486

(51) Int. Cl.[7] .............................................. G11C 11/00
(52) U.S. Cl. .................... 365/154; 365/233; 365/189.01
(58) Field of Search ................................. 365/154, 233, 365/189.01, 203, 230.08

(56) References Cited

U.S. PATENT DOCUMENTS 5,668,770 A      9/1997  Itoh et al.
6,597,629 B1 *   7/2003  Raszka et al. .............. 365/233

FOREIGN PATENT DOCUMENTS

| JP | 4-344395   | 5/1991 |
| JP | 9-51042    | 2/1996 |
| JP | 2002-100190 | 9/2000 |

\* cited by examiner

Primary Examiner—David Lam
(74) Attorney, Agent, or Firm—Reed Smith LLP; Stanley P. Fisher, Esq.; Juan Carlos A. Marquez, Esq.

(57) ABSTRACT

A semiconductor integrated circuit device provided with a SRAM realizing low power consumption and high speed is to be provided. Out of memory circuits which cause a timing generator circuit which selects writable and readable memory cells with the address selector circuit, conveys write signals to a memory cell selected by a write circuit, conveys read signals from a memory cell selected by a read circuit, and receives a clock signal, to generate operational timing signals to be conveyed to an address selector circuit, a write circuit and a read circuit, a circuit in which the operational timing is not too tight is configured of a higher threshold voltage MOSFET than the MOSFETs of other circuits.

17 Claims, 4 Drawing Sheets

SEMICONDUCTOR INTEGRATED CIRCUIT DEVICE

BACKGROUND OF THE INVENTION

The present invention relates to a semiconductor integrated circuit device, for instance a semiconductor integrated circuit device mounted with a memory circuit, such as a static random access memory (SRAM).

An example of static random access memory (SRAM) of which the cells, write column switch and the like are configured of higher threshold voltage MOSFETs and the sense amplifiers, of lower threshold voltage MOSFETs is disclosed in the Japanese Published Unexamined Patent Application No. 2002-100190. An example of SRAM of which memory cells consist of higher threshold voltage MOSFETs and other peripheral circuits use both lower threshold voltage and higher threshold voltage MOSFETs is disclosed in the Japanese Published Unexamined Patent Application No. Hei 9(1997)-51042. Further, an example of which the pull-up MOSFET has a higher threshold voltage than other N channel MOSFETs is disclosed in the Japanese Published Unexamined Patent Application No. Hei 4(1992)-344395.

Patent Reference 1: Japanese Published Unexamined Patent Application No. 2002-100190

Patent Reference 2: Japanese Published Unexamined Patent Application No. Hei 9(1997)-51042

Patent Reference 3: Japanese Published Unexamined Patent Application No. Hei 4(1992)-344395

SUMMARY OF THE INVENTION

The operations of a SRAM to be mounted on a large scale semiconductor integrated circuit device (LSI), such as a single-chip microcomputer (hereinafter referred to as an on-chip SRAM) can be broadly divided between (1) the route of access to memory cells—data transition to bit lines—data amplification—latching of output data—output and (2) that of access to memory cells and input of write data—data transition to bit lines (opening of write SW)—writing into memory cells.

The operating speed of the on-chip SRAM is regulated by the route stated in (1) above. Where the design uses a MOSFET device of a standard threshold voltage (Vth) (hereinafter referred to as a higher Vth device), the semiconductor integrated circuit device is likely to be operable at 133 MHz at the maximum. It would be useful for enabling the semiconductor integrated circuit device to be operated at an even higher speed, 200 MHz for instance, to reduce the threshold voltage Vth of the MOSFET device (hereinafter referred to as a lower Vth device). On the other hand, however, a lower Vth device involves a greater leak current and increased power consumption, thereby depriving the SRAM of its advantage of low power consumption. Thus in a SRAM, high speed and low power consumption are in a mutual trade-off relationship.

An object of the present invention is to provide a semiconductor integrated circuit device provided with a static random access memory realizing both low power consumption and high speed. The above-stated and other objects and novel features of the present invention will become more apparent from the following detailed description when taken in conjunction with the accompanying drawings.

Typical aspects of the invention disclosed in this application will be briefly described below. Out of memory circuits which cause a timing generator circuit which selects writable and readable memory cells with the address selector circuit, conveys write signals to a memory cell selected by a write circuit, conveys read signals from a memory cell selected by a read circuit, and receives a clock signal, to generate operational timing signals to be conveyed to an address selector circuit, a write circuit and a read circuit, a circuit in which the operational timing is not too tight is configured of a higher threshold voltage MOSFET than the MOSFETs of other circuits.

Out of memory circuits which cause a timing generator circuit which selects writable and readable memory cells with the address selector circuit, conveys write signals to a memory cell selected by a write circuit, conveys read signals from a memory cell selected by a read circuit, and receives a clock signal, to generate operational timing signals to be conveyed to an address selector circuit, a write circuit and a read circuit, a drive circuit for conveying operational timing signals to large load capacities is configured of a higher threshold voltage MOSFET of a greater channel width than the MOSFETs of other circuits, and causes drive currents corresponding to the load capacities to flow.

DETAILED DESCRIPTION OF THE PREFERRED EMBODIMENT

Figure 1:
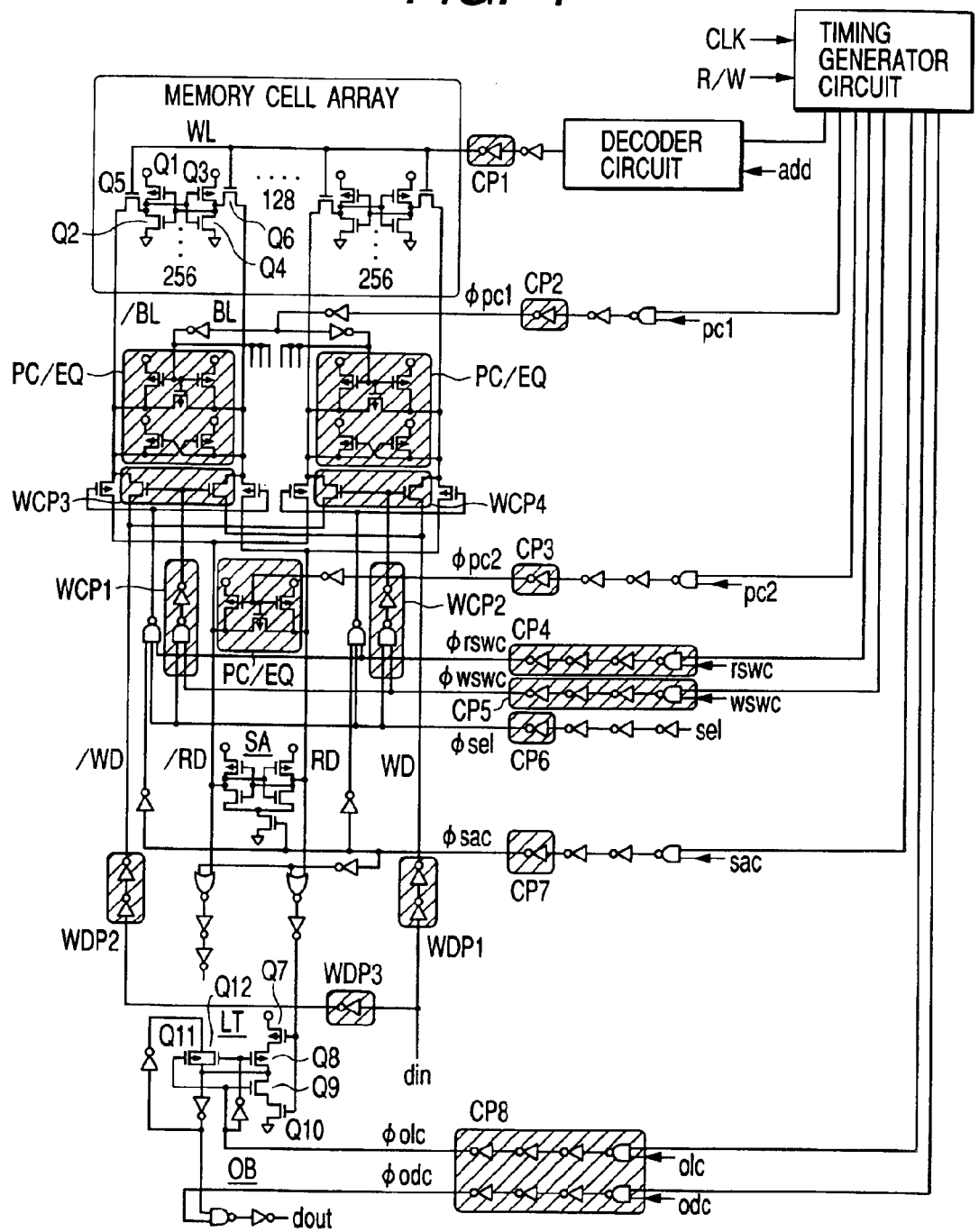
FIG. 1 is a circuit diagram of one embodiment of a static RAM (SRAM) to be mounted on a semiconductor integrated circuit device pertaining to the present invention.

FIG. 1 is a circuit diagram of one embodiment of a static RAM (SRAM) to be mounted on a semiconductor integrated circuit device pertaining to the present invention. The static RAM is configured of a memory cell array, an address selector circuit, a read circuit and a write circuit provided in its peripheral circuits and a timing generator circuit for controlling their operations.

The memory cell array is typically exemplified by one word line WL, two pairs of complementary bit lines BL and /BL, and two memory cells provided at their intersections. Each of the memory cells consists of a latch circuit where the inputs and the outputs of two CMOS inverter circuits, comprising P-channel MOSFETs Q1 and Q3 and N-channel MOSFETs Q2 and Q4, are cross-connected, and a selector switch consisting of N-channel MOSFETs Q5 and Q6 provided between a pair of input/output nodes of this latch circuit and the bit lines BL and /BL. The gates of these MOSFETs Q5 and Q6 are connected to the word line WL.

In the memory cell array, 128 memory cells are arranged on the one word line WL, though the number is not limited to this. Accordingly, the complementary bit lines BL and /BL consist of 128 pairs. On each pair of bit lines BL and /BL are arranged 256 memory cells. Therefore, there are a plurality of word lines WL, 256 unit lines for instance, numbered 0 through 255. Each of the bit lines BL and /BL is provided with a precharger/equalizer circuit PC/EQ. The precharger/ equalizer circuit PC/EQ is composed of a P-channel MOSFET for giving a precharge voltage, such as a source voltage, to the complementary bit lines BL and /BL and a P-channel MOSFET for short-circuiting the complementary bit lines BL and /BL. Between the complementary bit lines BL and /BL and a power supply terminal are provided P-channel MOSFETs, whose gates and drains are cross-connected, as pull-up MOSFETs.

The 128 pairs of bit lines are connected to 32 pairs of complementary read data lines RD and /RD by a read column switch consisting of a P-channel MOSFET. One pair of read data lines RD and /RD are connected to one or another of four pairs of bit lines BL and /BL. Each of the read data lines RD and /RD are provided with a sense amplifier SA. The sense amplifier SA is composed of a CMOS latch circuit configured by cross-connecting the inputs and the outputs of two CMOS inverter circuits, consisting of P-channel MOSFETs and N-channel MOSFETs, and an N-channel MOSFET provided between the sources of the N-channel MOSFETs of this CMOS latch circuit and the ground potential of the circuit. To match the arrangement of these 32 pairs of the read data lines RD and /RD, altogether 32 sense amplifiers SA are also provided.

A timing signal formed by the timing generator circuit and a timing control signal +sac formed by a gate circuit receiving a sense amplifier selection signal sac are conveyed via an inverter circuit constituting a control path CP7, to the gate of the N-channel MOSFET which activates the sense amplifier SA and the gate circuit which conveys an amplified signal from the sense amplifier SA. This timing control signal φsac is also used as the selection signal for the read column switch. The sense amplifier SA, activated by the selection signal, amplifies signals on the read data lines RD and /RD.

The amplified signal from the sense amplifier SA is conveyed to a latch circuit LT consisting of MOSFETs Q7 through Q11, and an output circuit OB generates an output signal dout. The latch circuit LT is configured of a through latch circuit controlled with a signal φolc generated on the basis of an output latch control signal olc. The output circuit OB is composed of a gate circuit and an output inverter circuit, controlled with a signal φodc generated on the basis of an output driver control signal odc.

The SRAM of this embodiment is enabled, though not limited to the arrangement described below, to selectively perform a read operation to activate all the 32 sense amplifiers SA and supply 32-bit read signals, a read operation to activate 16 of the 32 sense amplifiers SA and supply 16-bit read signals, or a read operation to activate eight of the 32 sense amplifiers SA and supply 8-bit read signals. The sense amplifier selection signal sac is used not only for controlling the sense amplifiers SA and other elements to match one or another of the three different read operations, but also as a non-selective signal for a read column switch consisting of a P-channel MOSFET with a read switch control signal rswc and a column selection signal sel.

The 128 pairs of bit lines are connected to 32 pairs of complementary write data lines WD and /WD by a write column switch (WCP4) consisting of N-channel MOSFETs. One pair of write data lines WD and /WD are connected the column switch to one or another of the four pairs of bit lines BL and /BL. The write data lines WD and /WD are provided with a write circuit (write amplifier), consisting of an inverter circuit column (WDP1) for conveying write signals din to the write data lines WD, an inverter circuit (WDP3) for generating inverted write signals and an inverter circuit column (WDP2) for conveying the inverted write signals to the write data lines /WD. To match the 32 pairs of complementary write data lines WD and /WD, there are configured 32 such write circuits, too.

The SRAM of this embodiment is enabled, though not limited to the arrangement described below, to selectively perform a write operation to validate 32-bit write signals generated by the 32 write amplifiers, a write operation to validate 16-bit read signals generated by 16 out of the 32 write amplifiers, or a write operation to validate 8-bit write signals generated by eight out of the 32 write amplifiers. Accordingly, a write switch control signal wswc is used. In this embodiment, the column selection signal is combined with the write switch control signal wswc and conveyed to a write column switch (WCP3) consisting of an N-channel MOSFET.

The amplified signal from the sense amplifier SA is conveyed to the MOSFETs Q7 through Q12 and the latch circuit consisting of an inverter circuit via the gate circuit, and the output signal dout is formed through the gate circuit and an output inverter circuit. To the gate of the N-channel MOSFET which activates the sense amplifier SA and the gate circuit which conveys the amplified signal from the sense amplifier SA are conveyed the timing signal generated by the timing generator circuit and the timing control signal φsac generated by the gate circuit which receives the sense amplifier selection signal sac via an inverter circuit constituting the control path CP7. This timing control signal φsac is also used as a non-selection signal for the read column switch.

The timing generator circuit, receiving a plurality of control signals typically represented by a clock CLK and a read/write control signal R/W, generates various timing signals required for the operation of the SRAM corresponding to the operating mode of the SRAM, such as a read operation, a write operation or a standby operation.

One of the 256 word lines WL is selected by a word driver CP1 receiving a selection signal generated by a decoder circuit. The decoder circuit, receiving a timing signal generated by the timing generator circuit and an address signal add, generates a selection signal for the word line and a column selection signal. The column selection signal generated by the decoder circuit is used for the generation of the control signals sac, rswc, wswc or the like by a logic circuit (not shown) to correspond to the 32-bit operation, 16-bit operation or 8-bit operation.

In developing a memory required to operate at high speed in connection with the present application for patent, it was conceived to use standard Vth devices (hereinafter referred to as higher Vth MOSs), as high speed devices, in combination with reduced Vth devices (hereinafter referred to as lower Vth MOSs). If lower Vth MOSs are used where high speed is required, they will be subject to a greater leak current than higher Vth MOSs would be, and accordingly invite an increase in power consumption when standing by or accessing a memory. For this reason, delay path analysis was attempted with a view to realizing high speed while preventing an increase in power consumption due to a leak current, and it has been conceived to use higher Vth MOSs on paths on which no high speed operation is required and in limited positions even on paths on which high speed operation is required.

(1) Output data path: As this address decode—access to memory cells—memory data amplification—output latch—output driver path determines the operating speed of memories, it is required to allow high speed operation. Therefore, lower Vth devices are used for all the circuits on this path. Thus the P-channel MOSFET constituting the read column switch, the sense amplifiers SA, the latch circuit LT and the output circuit OB in FIG. 1 are composed of lower Vth MOSFETs.

(2) Output control paths: Of the output control paths, since those for the output latch control signal and the output driver control signal involve the processing of data delayed by the time taken for memory access (address pre-decode)—memory data amplification (sense margin), there is some time allowed for the arrival of the data at the circuits. Therefore, higher Vth MOSs are used for the output latch control signal and output driver control signal paths. Thus, a control path CP8 in FIG. 1 in which the control signal olc and odc and the timing signal from the timing generator circuit are received and the signals $\phi$olc and $\phi$odc are generated is configured of higher Vth MOSs.

(3) Write control path: When considering an operation to write into a memory, it is sufficient for writing into the memory cells to be completed in one operation cycle, and the writing into memory cells constitutes the end point for data and the control signals. Therefore, by setting the write period in the latter half of the operation cycle in the timing design, it is made possible to use higher Vth MOSs for the write data path and the write control signal path. Thus, the write data input paths WDP1 through WDP3, the write control paths CP5, WCP1 and WCP2 for generating the write selection signal $\phi$wswc and the write column switches WCP3 and WCP4 in FIG. 1 are configured of higher Vth MOSs.

(4) Final driver stage for direct inputting to peripheral circuit section: The final driver stage from which direct inputting to the peripheral circuit section is done is inevitably subject to a greater drive load, and accordingly the gate width of MOSs becomes greater. Therefore, a higher Vth MOS is used only at the final stage where the gate width is greater, and the design is made to provide a gate width to provide a comparable drive capacity to lower Vth MOSs to allow high speed operation. Thus, in FIG. 1, the word driver CP1 generating the word line selection signal, the final stage path CP2 on which the control signal $\phi$pc1 for the precharger/equalizer circuit is generated, and the final stage paths CP4 and CP6 on which the selection signal $\phi$rswc for the read column switch is generated are configured of higher Vth MOSs.

(5) Precharger/equalizer circuit: Since the precharger/equalizer circuit need not operate at high speed if the performance requirement can be satisfied within the allowance of the operational timing, the MOS gate width is designed with the use of higher Vth MOSs being presupposed. Thus, the precharger/equalizer circuit PC/EQ provided on the bit lines BL and /BL and the read data lines RD and /RD and the pull-up MOSFET contained in the precharger/equalizer circuit PC/EQ provided on the bit lines BL and /BL in FIG. 1 are configured of higher Vth MOSs.

What is meant by designing the MOS gate width with the use of higher Vth MOSs being presupposed is that, where higher Vth MOSs with a smaller drive current for the load than lower Vth MOSs are to be used, the decrement in the drive current for the load is compensated for by increasing the channel width. Increasing the channel width, though entailing a greater leak current in proportion to that channel width, can make the leak current smaller than when lower Vth MOSs are used for letting the same drive current flow. This principle is applied to realize high speed and low power consumption.

As described above in the SRAM to be mounted on a semiconductor integrated circuit device using both higher Vth MOSs and lower Vth MOSs, (A) on the paths where the timing is not very tight including higher Vth MOSs are selectively used as elements for the latch control signal path of output data and the driver control signal path of the output section in (1) and elements of the write data input path and the write SW control signal path in (2) to reduce current consumption. (B) As the driver stage for direct inputting to the peripheral circuit section where the drive load is heavier increases in gate width, higher Vth devices are used to keep current consumption lower. (C) Since the precharger/equalizer circuit need not operate at high speed if the performance requirement can be satisfied, higher Vth devices are used to reduce current consumption. By using higher Vth devices in (A) through (C) above and lower Vth devices for other elements, both high speed and low power consumption can be achieved at the same time.

Figure 2:
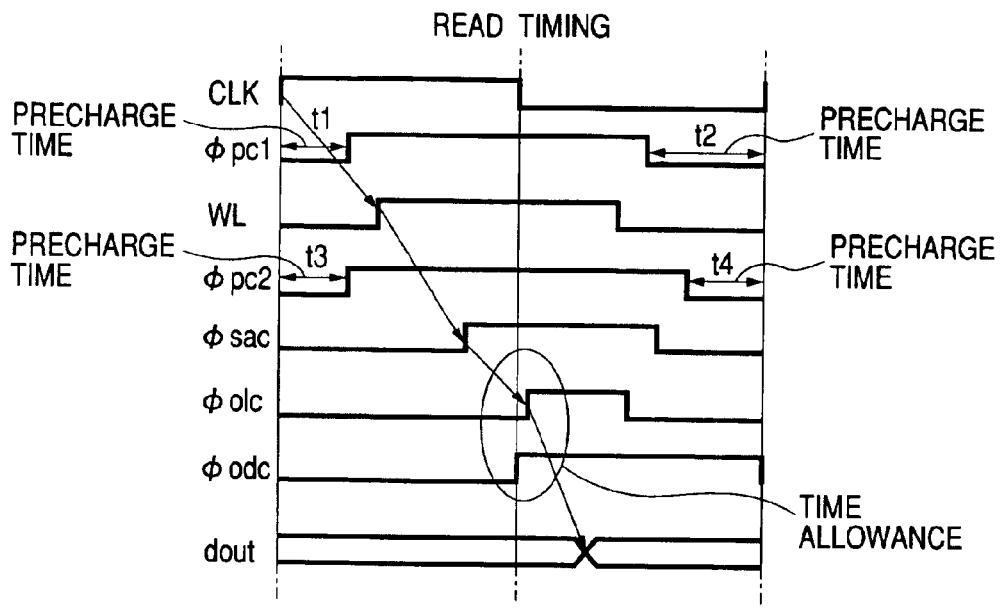
FIG. 2 is a timing chart for explaining one example of operation to read out of the SRAM pertaining to the present invention.

FIG. 2 is a timing chart for explaining one example of operation to read out of the SRAM pertaining to the present invention. The SRAM of this embodiment supplies a read signal DOUT in one cycle of a clock CLK. An address (not shown) is made definite in synchronism with the leading edge of the clock CLK, and precharge signals $\phi$pc1 and $\phi$pc2 vary to a high level in the lapse of periods of time t1 and t3 to end the precharging (equalization). After that, the address is deciphered to select a word line WL.

The operation to select a word line results in potential variations on the bit lines BL and /BL according to information stored in the memory cells. These variations are conveyed to the read data lines RD and /RD via the read column switch, and a sense amplifier activating signal SA causes a sense amplifier to generate an amplified signal through its operation. This amplified signal is taken into the latch circuit in response to the latch control signal $\phi$olc, and the output driver control signal $\phi$odc causes the output circuit to supply an output signal DOUT. In this way, the latch control signal $\phi$olc and the output driver control signal $\phi$odc can be generated at a timing matched to the data coming delayed by the memory access—memory data amplifying time from the clock CLK, which means a corresponding time allowance. One cycle of the clock CLK is set to end with precharge times t2 and t4.

Therefore, the precharge times are set to t1+t2 and t3+t4 with the precharge times t1 and t2 of the current cycle being added to the precharge times t2 and t4 of the previous cycle, respectively. One cycle of the clock CLK consists of the precharge times and the time taken between the memory cells and the data output. Accordingly, while high speed indispensably requires increasing the speed of word line WL selection and that of amplification by the sense amplifiers SA, the output control path can use higher Vth devices as stated above.

Figure 3:
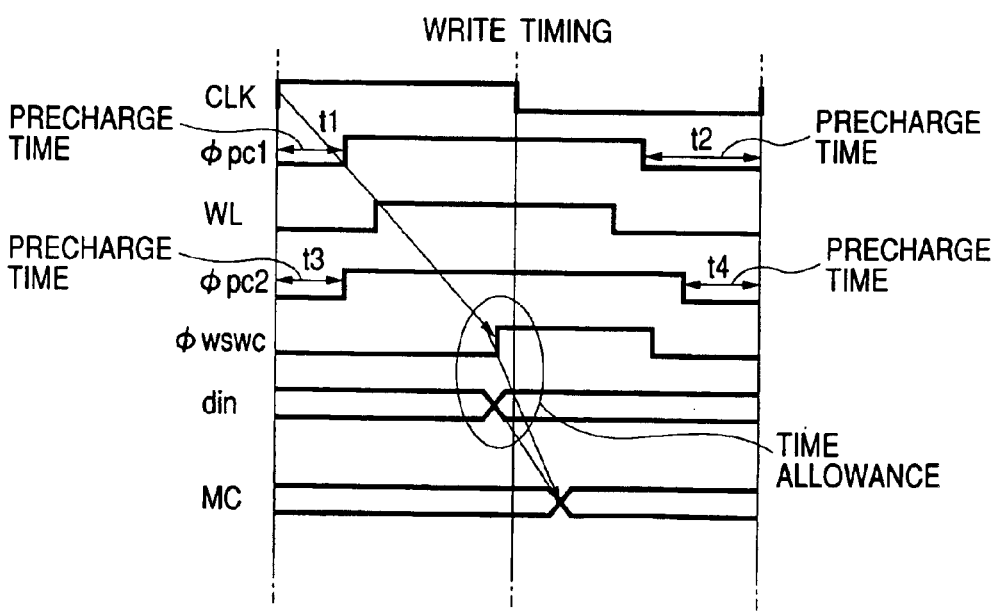
FIG. 3 is a timing chart for explaining one example of operation to write into the SRAM pertaining to the present invention.

FIG. 3 is a timing chart for explaining one example of operation to write into the SRAM pertaining to the present invention. In the SRAM of this embodiment, a write signal DIN is written into the memory cells in one cycle of the clock CLK. As described with respect to the read signal, an address (not shown) is made definite in synchronism with the leading edge of the clock CLK, and precharge signals $\phi$pc1 and $\phi$pc2 vary to a high level in the lapse of periods of time t1 and t3 to end the precharging (equalization). After that, the address is deciphered to select a word line WL.

Since the duration of the word line is so secured as to secure the precharge times t2 and t4, it is sufficient to write into the memory cells while the word line is being selected.

For this reason, the timing of inputting the write switch control signal φwswc and that of inputting the write signal DIN into the memory cells have only to permit completion of their inputting early enough to secure the precharge time t4, which means a corresponding time allowance. Therefore, as stated above, the write control path and the write data path can use higher Vth devices.

Figure 4:
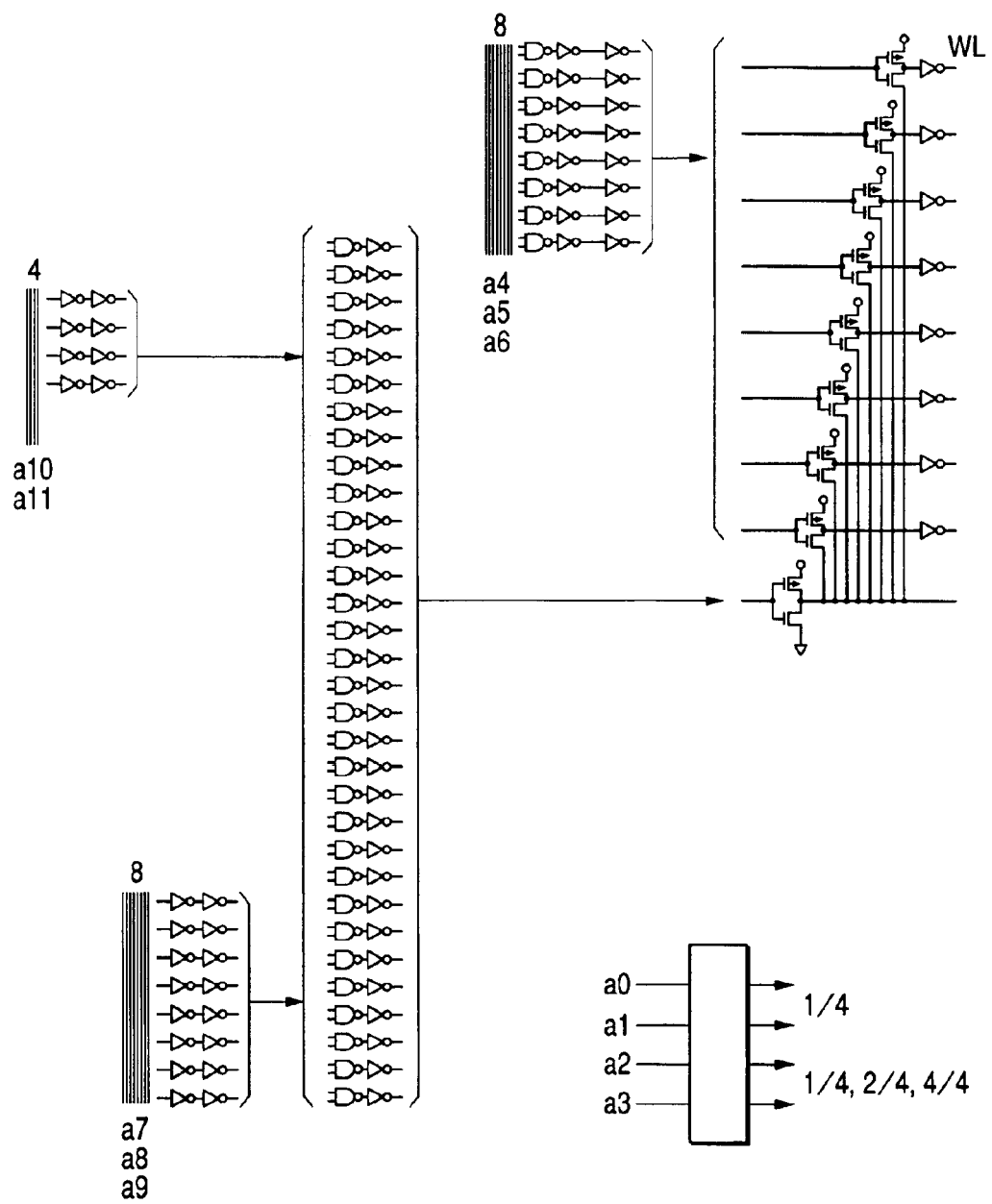
FIG. 4 is a circuit diagram showing one embodiment of a decoder circuit of the SRAM of FIG. 1.

FIG. 4 is a circuit diagram showing one embodiment of the decoder circuit of the SRAM of FIG. 1. Four different pre-decode signals are formed of two bits of address signals a10 and a11; eight different pre-decode signals are formed of three bits of address signals a7 through a9; and 32 different pre-decode signals are formed as the four pre-decode signals formed of a10 and a11 and the eight different pre-decode signals formed of a7 through a9 are entered into the two-input gate circuit. FIG. 4 illustrates a NAND gate circuit and an inverter circuit generating half of them, i.e. 16 different pre-decode signals.

Eight different pre-decode signals are formed of three bits of address signals a4 through a5. There are provided eight CMOS inverter circuits each receiving one or another of the eight pre-decode signals and another CMOS inverter circuit to give a ground potential or a source voltage to the sources of the N-channel MOSFETs of these eight CMOS inverter circuits, and a 1/32 pre-decode signal designated by the address signals a11 through a7 is supplied. A signal to select one out of the 32×8=256 word lines WL is thereby generated.

The address signals a0 and a1 are provided to form a 1/4 column selection signal for connecting the four pairs of bit lines BL and /BL to the read data lines RD and /RD and the write data lines WD and /WD. The address signals a2 and a3 are selectively validated according to the operating mode. For instance, if the address signals a2 and a3 are validated, a select signal to designate 1/4 of the 32 sense amplifiers or write amplifiers, i.e. eight sense amplifiers or write amplifiers, is generated.

If the address signal a2 is invalidated and the address signal a3 is validated, a select signal to designate 2/4 of the 32 sense amplifiers or write amplifiers, i.e. 16 sense amplifiers or write amplifiers, is generated. If the address signals a2 and a3 are invalidated, a select signal to designate 4/4 or all of the 32 sense amplifiers or write amplifiers is generated. In this manner, a select signal to designate 1/4, 2/4 or 4/4 is generated according to the operating mode, thereby making it possible to read or write data in the 8-bit, 16-bit or 32-bit units. These decoder circuits are composed of lower Vth MOSs to achieve high speed.

Figure 5:
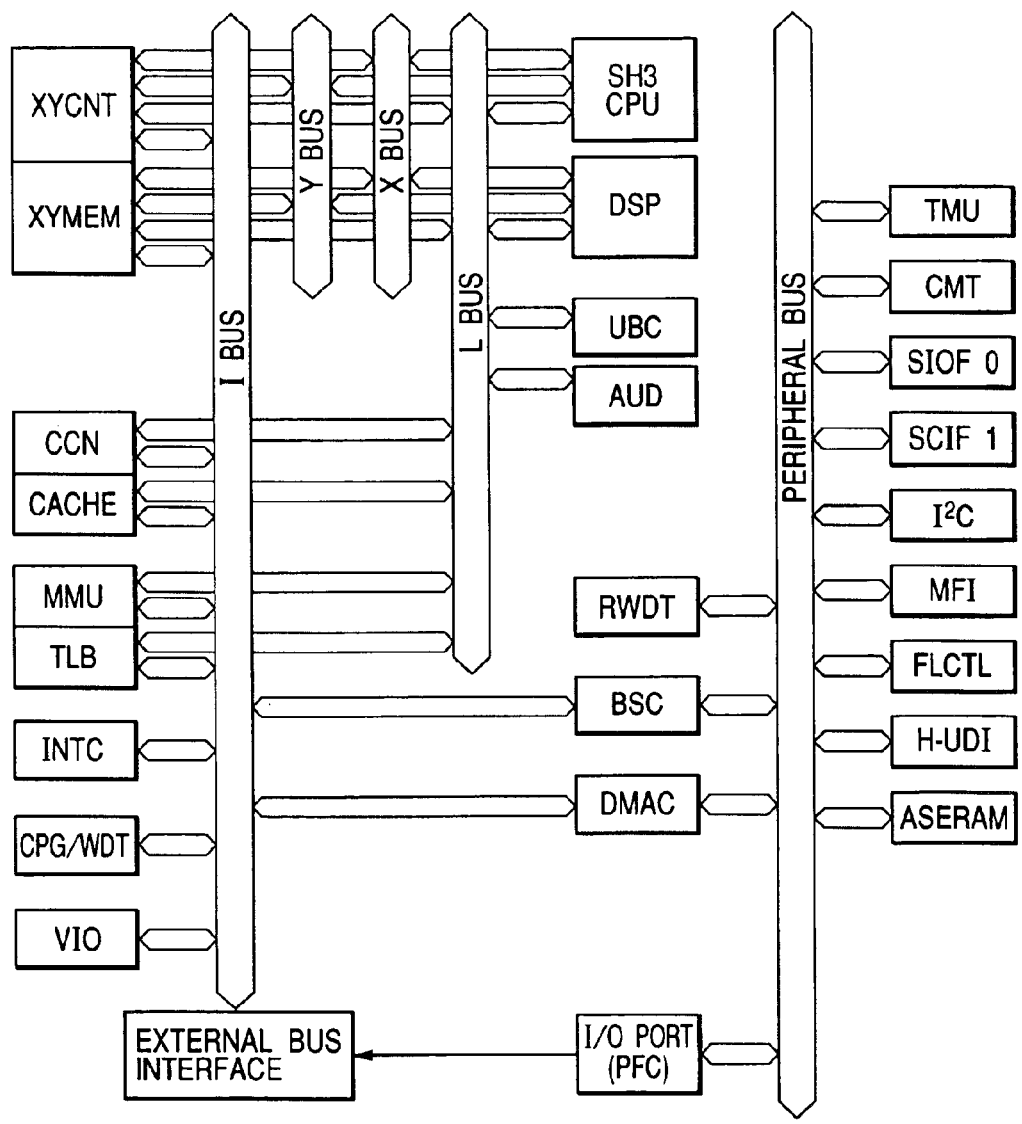
FIG. 5 is a block diagram showing one embodiment of a microcomputer LSI to which the invention is applied.

FIG. 5 is a block diagram showing one embodiment of a processing device, such as a microprocessor (hereinafter referred to as a microcomputer LSI), to which the invention is applied. Every circuit block in the diagram is formed over a single substrate, such as monocrystalline silicon substrate, by a known manufacturing technique for complementary MOS (CMOS) semiconductor integrated circuits.

The microcomputer LSI is intended, though not limited to the arrangement described below, to realize high performance arithmetic processing with a central processing unit of a reduced instruction set computer (RISC) type central processing unit CPU, to integrate peripheral devices needed for system configuration, and to be applicable to mobile devices. The central processing unit CPU has a set of RISC type instructions, of which basic ones, carrying out pipeline processing, operate on a one statement per instruction basis (one system clock cycle). Around this central processing unit CPU and a data signal processor DSP, there are mounted the following peripheral circuits for use in, for instance, a mobile telephone.

Internal buses consist of an I bus, a Y bus, an X bus, an L bus and a peripheral bus, and in order to minimize the number of components required to configure the user system, there are provided a memory XYMEM for image processing and a memory controller XYCNT as built-in peripheral modules. These memory XYMEM and controller XYCNT are connected to the I bus, X bus, Y bus and L bus to accomplish data inputting/outputting for image processing and data output operation for displaying. As the memory XYMEM, a SRAM such as the one shown in FIG. 1 is used.

On the I bus are provided a cache memory CACHE, a cache memory controller CCN, a memory management controller MMU, a translation look-aside buffer TLB, an interrupt controller INTC, a clock oscillator/watchdog timer CPG/WDT, a video I/O module VIO and an external bus interface. Connection to an external memory LSI memory (not shown) and the like is established via this external bus interface.

To the L bus are connected the cache memory CACHE, the cache memory controller CCN, the memory management controller MMU, the translation look-aside buffer TLB, the central processing unit CPU, the data signal processor DSP, a user break controller UBC and an advanced user debugger AUD.

To the peripheral bus are connected a 16-bit timer unit TMU, a compare-match timer CMT, a serial I/O (with FIFO) SIOFO, a serial communication interface SCIFI with built-in FIFO, an $I^2$ controller $I^2C$, a multifunctional interface MFI, a NAND/AND flash interface FLCTL, a user debug interface H-UDI, an ASE memory ASERAM, a pin function controller PFC, an RCLK operation watchdog timer RWDT. To the peripheral bus and the I bus are connected a bus state controller BSC and a direct memory access controller DMAC.

It is made possible to increase the operating speed and reduce the power consumption of the memory XYMEM for image processing, and accordingly to realize an LSI satisfying the requirement for high speed operation and reduced in power consumption. By applying the invention under the present application to the on-chip memory of a system LSI, a high performance LSI can be realized.

While the foregoing description concerned the invention achieved by the present inventor with respect to a specific embodiment thereof, the invention obviously is not limited to that embodiment, but can be modified in various ways without deviating from the essentials of the invention. For instance, the numbers of word lines and bit lines constituting the memory cell array of the SRAM to be mounted on a semiconductor integrated circuit device can be varied in many different ways. Since the load capacity of the final stage of the control path CP1 and others differ with the numbers of word lines and bit lines, the channel width of higher Vth MOSs is so determined as to obtain a drive current matching the load capacity. The SRAM is not only mounted in mixture in a semiconductor integrated circuit device, but also can similarly be applied to a DRAM as a general purpose memory. The invention can be extensively utilized for semiconductor integrated circuit devices including memory circuits of the above-described type.

Advantages achieved by the invention disclosed in this application in its typical aspects will be briefly described below. Out of memory circuits which cause a timing generator circuit which selects writable and readable memory cells with the address selector circuit, conveys write signals to a memory cell selected by a write circuit, conveys read signals from a memory cell selected by a read circuit, and receives a clock signal, to generate operational timing signals to be conveyed to an address selector circuit, a write circuit and a read circuit, a circuit in which the operational timing is not too tight is configured of a higher threshold voltage MOSFET than the MOSFETs of other circuits, and this enables high speed and low power consumption to be achieved at the same time.

Out of memory circuits which cause a timing generator circuit which selects writable and readable memory cells with the address selector circuit, conveys write signals to a memory cell selected by a write circuit, conveys read signals from a memory cell selected by a read circuit, and receives a clock signal, to generate operational timing signals to be conveyed to an address selector circuit, a write circuit and a read circuit, a drive circuit for conveying operational timing signals to large load capacities is configured of a higher threshold voltage MOSFET of a greater channel width than the MOSFETs of other circuits, and causes drive currents matching the load capacities to flow, thereby making it possible to achieve high speed and low power consumption at the same time.

What is claimed is:

1. A semiconductor integrated circuit device comprising:
   writable and readable memory cells;
   an address selector circuit for subjecting said memory cells to selection;
   a write circuit for conveying write signals to memory cells selected by said address selector circuit;
   a read circuit for conveying read signals from memory cells selected by said address selector circuit; and
   a timing generator circuit which receives a clock signal and generates operational timing signals to be conveyed to said address selector circuit, write circuit and read circuit,
   wherein any circuit in which the operational timing is not too tight is configured of a higher threshold voltage MOSFET than the MOSFETs of other circuits.

2. The semiconductor integrated circuit device according to claim 1,
   wherein said memory cells are configured of said higher threshold voltage MOSFETs, and
   wherein said circuit in which the operational timing is not too tight is comprised of a circuit which gives operational timing signals to an output circuit contained in said read circuit.

3. The semiconductor integrated circuit device according to claim 2,
   wherein said circuit in which the operational timing is not too tight comprises a write amplifier which is included in said write circuit and generates write signals, a column switch exclusively for writing which is included in said address selector circuit, and a circuit for conveying a selection signal to the column switch.

4. The semiconductor integrated circuit device according to claim 3,
   wherein said memory cells are static memory cells provided at the intersections of complementary bit lines and word lines, and
   wherein said complementary bit lines and read complementary read signal lines include as said circuit in which the operational timing is not too tight a precharger/equalizer circuit configured of said higher threshold voltage MOSFET.

5. The semiconductor integrated circuit device according to claim 1,
   wherein said circuit in which the operational timing is not too tight comprises a write amplifier which is included in said write circuit and generates write signals, a column switch exclusively for writing which is included in said address selector circuit, and a circuit for conveying a selection signal to the column switch.

6. The semiconductor integrated circuit device according to claim 5,
   wherein said memory cells are static memory cells provided at the intersections of complementary bit lines and word lines, and
   wherein said complementary bit lines and read complementary read signal lines include as said circuit in which the operational timing is not too tight a precharger/equalizer circuit configured of said higher threshold voltage MOSFET.

7. A semiconductor integrated circuit device comprising:
   writable and readable memory cells;
   an address selector circuit for subjecting said memory cells to selection;
   a write circuit for conveying write signals to memory cells selected by said address selector circuit;
   a read circuit for conveying read signals from memory cells selected by said address selector circuit; and
   a timing generator circuit which receives a clock signal and generates operational timing signals to be conveyed to said address selector circuit, write circuit and read circuit,
   wherein each of the drive circuits for conveying operational timing signals to large load capacities is configured of a higher threshold voltage MOSFET of a greater channel width than the MOSFETs of other circuits, and causes drive currents matching the load capacities to flow.

8. The semiconductor integrated circuit device according to claim 7,
   wherein the drive circuits for conveying operational timing signals to large load capacities are a word driver and a driver supplying timing signals having a greater number of fan-outs.

9. The semiconductor integrated circuit device according to claim 8,
   wherein said circuit in which the operational timing is not too tight is comprised of said higher threshold voltage MOSFET.

10. The semiconductor integrated circuit device according to claim 9,
    wherein said memory cells are comprised of said higher threshold voltage MOSFETs, and
    wherein said circuit in which the operational timing is not too tight is comprised of a circuit for giving operational timing signals to an output circuit included in said read circuit.

11. The semiconductor integrated circuit device according to claim 10,
    wherein said circuit in which the operational timing is not too tight comprises a write amplifier which is included in said write circuit and generates write signals, a column switch exclusively for writing which is included in said address selector circuit, and a circuit for conveying a selection signal to the column switch.

12. The semiconductor integrated circuit device according to claim 11, wherein said memory cells are static memory cells provided at the intersections of complementary bit lines and word lines, and wherein said complementary bit lines and read complementary read signal lines include as said circuit in which the operational timing is not too tight a precharger/equalizer circuit configured of said higher threshold voltage MOSFET.

13. A semiconductor integrated circuit device comprising:

writable and readable memory cells;

an address selector circuit for subjecting said memory cells to selection;

a write circuit for conveying write signals to memory cells selected by said address selector circuit;

a read circuit for conveying read signals from memory cells selected by said address selector circuit; and a timing generator circuit which receives a clock signal and generates operational timing signals to be conveyed to said address selector circuit, write circuit and read circuit, wherein said read circuit has a data output latch circuit and a data output buffer, wherein said timing generator circuit has a first circuit for giving a latch timing signal to said data output latch circuit, and a second circuit for giving a data output timing signal to said data output buffer, and wherein the output transistors of said first and second circuits are made greater in size and their threshold voltages are higher than those of the transistors constituting other circuits.

14. The semiconductor integrated circuit device according to claim 13, wherein a plurality of sets of said data output latch circuits and said data output buffers are provided.

15. The semiconductor integrated circuit device according to claim 14, wherein said memory cells is comprised of the higher threshold voltage MOSFETs.

16. The semiconductor integrated circuit device according to claim 15, wherein said address selector circuit has a word line driver circuit for driving word lines, and wherein other circuits than the final stage circuit of said word line driver circuit are configured of lower threshold voltage transistors.

17. The semiconductor integrated circuit device according to claim 15, wherein said memory cells are static memory cells provided at the intersections of complementary bit lines and word lines, and wherein said complementary bit lines and read complementary read signal lines include as said circuit in which the operational timing is not too tight a precharger/equalizer circuit configured of said higher threshold voltage MOSFET.

* * * * *